United States Patent
Wehner et al.

(10) Patent No.: US 9,536,917 B2
(45) Date of Patent: Jan. 3, 2017

(54) TWO COLOR DETECTOR LEVERAGING RESONANT CAVITY ENHANCEMENT FOR PERFORMANCE IMPROVEMENT

(71) Applicant: RAYTHEON COMPANY, Waltham, MA (US)

(72) Inventors: Justin Gordon Adams Wehner, Goleta, CA (US); Edward P. Smith, Goleta, CA (US); Stephanie Bostwick, El Segundo, CA (US)

(73) Assignee: RAYTHEON COMPANY, Waltham, MA (US)

( * ) Notice: Subject to any disclaimer, the term of this patent is extended or adjusted under 35 U.S.C. 154(b) by 144 days.

(21) Appl. No.: 14/084,276

(22) Filed: Nov. 19, 2013

(65) Prior Publication Data

US 2015/0137295 A1 May 21, 2015

(51) Int. Cl.

| | |
|---|---|
| *H01L 27/146* | (2006.01) |
| *H01L 31/102* | (2006.01) |
| *H01L 31/109* | (2006.01) |
| *H01L 31/0232* | (2014.01) |
| *H01L 31/0304* | (2006.01) |
| *H01L 31/101* | (2006.01) |

(52) U.S. Cl.
CPC .... *H01L 27/14629* (2013.01); *H01L 27/14669* (2013.01); *H01L 31/02327* (2013.01); *H01L 31/03046* (2013.01); *H01L 31/109* (2013.01); *H01L 31/1013* (2013.01); *Y02E 10/544* (2013.01)

(58) Field of Classification Search
CPC .... H01L 27/144; H01L 31/0232; H01L 31/09; H01L 31/11; H01L 31/18; H01L 27/146; H01L 27/14629; H01L 27/14669; H01L 31/102; H01L 31/109; H01L 31/02325; H01L 31/02327; H01L 31/1013; H01L 31/03046
See application file for complete search history.

(56) References Cited

U.S. PATENT DOCUMENTS

| | | | |
|---|---|---|---|
| 5,227,648 | A | 7/1993 | Woo |
| 5,455,421 | A | 10/1995 | Spears |

(Continued)

OTHER PUBLICATIONS

Wehner et al., "Mercury cadmium telluride resonant-cavity-enhanced photoconductive infrared detectors," Applied Physics Letters, 87:211104, 2005.

(Continued)

*Primary Examiner* — Fazli Erdem
(74) *Attorney, Agent, or Firm* — Lewis Roca Rothgerber Christie LLP

(57) ABSTRACT

Methods and structures for providing single-color or multi-color photo-detectors leveraging cavity resonance for performance benefits. In one example, a radiation detector (110) includes a semiconductor absorber layer (210, 410A, 410B, 610, 810, 1010, 1030, 1210, 1230) having a first electrical conductivity type and an energy bandgap responsive to radiation in a first spectral region, a semiconductor collector layer (220, 630, 830, 1020, 1040) coupled to the absorber layer (210, 410A, 41013, 610, 810, 1010, 1030, 1210, 1230) and having a second electrical conductivity type, and a resonant cavity coupled to the collector layer (220, 630, 830, 1020, 1040) and having a first mirror (240) and a second mirror (245).

17 Claims, 11 Drawing Sheets

(56) References Cited

U.S. PATENT DOCUMENTS

| | | | |
|---|---|---|---|
| 5,808,329 A * | 9/1998 | Jack et al. | 257/188 |
| 5,808,350 A * | 9/1998 | Jack et al. | 257/440 |
| 6,013,912 A * | 1/2000 | Pautrat et al. | 250/226 |
| 6,034,407 A * | 3/2000 | Tennant et al. | 257/440 |
| 6,452,187 B1 * | 9/2002 | Claiborne et al. | 250/370.12 |
| 6,667,479 B2 * | 12/2003 | Ray | 250/338.1 |
| 6,897,447 B2 * | 5/2005 | Mitra | 250/339.02 |
| 6,920,290 B2 * | 7/2005 | Mitra | 398/207 |
| 7,135,698 B2 * | 11/2006 | Mitra | 257/21 |
| 7,541,584 B2 * | 6/2009 | Antoszewski et al. | 250/338.4 |
| 8,559,113 B2 * | 10/2013 | Wehner | 359/589 |
| 2004/0108564 A1 * | 6/2004 | Mitra | H01L 27/14649 257/442 |
| 2006/0118721 A1 * | 6/2006 | Antoszewski | G01J 3/02 250/338.4 |
| 2008/0111152 A1 * | 5/2008 | Scott | H01L 27/14603 257/188 |
| 2008/0217542 A1 * | 9/2008 | Verma et al. | 250/370.01 |
| 2011/0095334 A1 * | 4/2011 | Scott | H01L 27/1446 257/188 |
| 2011/0127547 A1 * | 6/2011 | Wang et al. | 257/84 |
| 2011/0147877 A1 * | 6/2011 | Wehner | H01L 27/1446 257/446 |
| 2012/0273838 A1 * | 11/2012 | Kinch | H01L 31/02966 257/188 |
| 2013/0009045 A1 * | 1/2013 | Smith et al. | 250/214.1 |
| 2013/0228887 A1 * | 9/2013 | Wehner et al. | 257/432 |
| 2014/0055845 A1 * | 2/2014 | Jain | 359/344 |

OTHER PUBLICATIONS

Wehner et al., "Responsivity and lifetime of resonant-cavity-enhanced HgCdTe detectors," Solid-State Electronics, 50:1640-1648, 2006.

Wehner et al., "Mercury Cadmium Telluride/Cadmium Telluride Distributed Bragg Reflectors for Use with Resonant Cavity-Enhanced Detectors," Journal of Electronic Materials, 34(6):1-6, 2005.

Rogalski, "HgCdTe Infrared Detector Material: History, Status and Outlook", Reports on Progress in Physics, Institute of Physics Publishing, Bristol, GB, vol. 68, No. 10, Aug. 22, 2005 (pp. 2267-2336).

Written Opinion of the International Searching Authority for International Application No. PCT/US2014/065067, filed Nov. 11, 2014, Written Opinion of the International Searching Authority mailed Mar. 17, 2015 (7 pgs.).

International Search Report for International Application No. PCT/US2014/065067, filed Nov. 11, 2014, International Search Report dated Mar. 10, 2015 and mailed Mar. 17, 2015 (4 pgs.).

* cited by examiner

TWO COLOR DETECTOR LEVERAGING RESONANT CAVITY ENHANCEMENT FOR PERFORMANCE IMPROVEMENT

CROSS-REFERENCE TO RELATED APPLICATION(S)

This application incorporates by reference in its entirety, as if set forth in full, U.S. Pat. No. 8,143,687 ("the '687 Patent") entitled "MULTI-BAND, REDUCED-VOLUME RADIATION DETECTORS AND METHODS OF FORMATION".

BACKGROUND

1. Field

One or more aspects of embodiments according to the present invention relate to infrared detectors, and more particularly to infrared detectors employing a cavity resonator, and including two semiconductor layers to detect two wavelength ranges.

2. Description of Related Art

Infrared detectors are used in a wide variety of applications including, for example, remote sensing, infrared astronomy, and various military applications. Infrared detectors are generally sensitive to thermal noise, and may therefore be cooled to cryogenic operating temperatures, for example, approximately 77 Kelvin (K). Recently, there has been a significant interest in higher operating temperature (HOT) infrared detectors, particularly HOT infrared focal plane arrays (FPAs), to remove or reduce the need for expensive cooling systems. Current approaches to realizing HOT detectors have focused on either the material design to address fundamental mechanisms such as Auger recombination, or reducing the volume of the detector to reduce sensitivity to thermal noise. However, by focusing on only one aspect of the problem at a time (either recombination or volume reduction), current approaches limit their utility, and even when ideally implemented, these solutions do not necessarily achieve a high enough operating temperature to provide significant benefit. Further, volume reduction techniques typically focus on single absorber/single color devices, resulting in narrow band devices, limiting their usefulness. By including multiple absorbers multi-color and broadband devices are realizable.

SUMMARY

Aspects and embodiments are directed to methods and apparatus for achieving a HOT detector that address both volume reduction and management of recombination mechanisms in one device, thereby providing a superior solution. As discussed in more detail below, certain embodiments are directed to a focal plane array or other infrared detector that includes a resonant cavity in combination with a reduction in thickness of an absorber layer of the device. These detectors may be single-color or dual-color.

According to an embodiment of the present invention there is provided a detector for detecting light at a first wavelength and at a second wavelength, the first wavelength being shorter than the second wavelength, the detector including: first and second mirrors, forming an optical cavity, the optical cavity being resonant at the second wavelength; and first, and second semiconductor layers within the optical cavity; the first semiconductor layer having a bandgap sufficiently low to detect the first wavelength and sufficiently high to be substantially transparent to the second wavelength, and the second semiconductor layer having a bandgap sufficiently low to detect the second wavelength.

In one embodiment, the detector includes a third semiconductor layer.

In one embodiment, the third semiconductor layer is between the first semiconductor layer and the second semiconductor layer.

In one embodiment, the third semiconductor layer is a barrier layer.

In one embodiment, the width of the second layer is less than 2 times a depletion width of the detector.

In one embodiment, the first semiconductor layer and the second semiconductor layer are composed of a semiconductor of a first conductivity type, and the third semiconductor layer is composed of a semiconductor of a second conductivity type, the second conductivity type being different from the first conductivity type.

In one embodiment, the width of the second layer is less than 2 times a depletion width of the detector.

In one embodiment, the first semiconductor layer is composed of n-type semiconductor, the second semiconductor layer is composed of n-type semiconductor, and the third semiconductor layer is composed of p-type semiconductor.

In one embodiment, the detector includes a fourth semiconductor layer adjacent the second semiconductor layer, the fourth semiconductor layer being composed of a semiconductor of the same conductivity type as the second semiconductor layer, and the fourth semiconductor layer having a higher doping density than the second semiconductor layer.

In one embodiment, the first mirror and the second mirror are configured to provide, when the detector is illuminated by light at the second wavelength, an increased electric field amplitude in the second layer.

In one embodiment, the third semiconductor layer is a barrier layer.

In one embodiment, the width of the second layer is less than 2 times a depletion width of the detector.

In one embodiment, the second semiconductor layer is between the first semiconductor layer, and the third semiconductor layer.

In one embodiment, the first semiconductor layer and the second semiconductor layer are composed of a semiconductor of a first conductivity type, and the third semiconductor layer is composed of a semiconductor of a second conductivity type, the second conductivity type being different from the first conductivity type.

In one embodiment, the first semiconductor layer is composed of n-type semiconductor, the second semiconductor layer is composed of n-type semiconductor, and the third semiconductor layer is composed of p-type semiconductor.

In one embodiment, the first mirror and the second mirror are configured to provide, when the detector is illuminated by light at the second wavelength, an increased electric field amplitude in the second layer.

In one embodiment, an array of the detectors includes a substrate, the substrate being wedged.

In one embodiment, the detector includes a third semiconductor layer and a fourth semiconductor layer, the third semiconductor layer being a barrier layer and being between the first semiconductor layer and the fourth semiconductor layer, the first semiconductor layer, the second semiconductor layer, and the fourth semiconductor layers being composed of semiconductor material of the same conductivity type.

In one embodiment, the detector includes a contact adjacent the second mirror.

In one embodiment, the contact is reflective and the contact is configured to enhance the reflectivity of the second mirror.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a two color detector leveraging resonant cavity enhancement for performance improvement provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Higher operating temp (HOT) focal plane arrays, or other infrared detectors, may be achieved through various mechanisms, some of which include reducing the volume of the detector. As discussed above, infrared detectors are sensitive to thermal noise, which is why these detectors are typically cooled to cryogenic operating temperatures. Noise mitigation may be achieved by volume reduction of the noisier bandgap regions within the infrared detector. However, reducing the detector volume may result in lost performance. Accordingly, aspects and embodiments are directed to a mechanism for compensating for this lost performance. In particular, aspects and embodiments provide an approach for realizing a HOT detector that addresses both the relationship between detector volume and quantum efficiency and the fundamental recombination mechanisms that limit performance at high temperatures. According to one embodiment, a HOT detector leverages resonant cavity enhancement for performance improvement. As discussed in more detail below, this technique may provide a powerful resonant structure to allow two-fold improvement as the longer wavelength absorber may be both very small and in some instances fully depleted.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
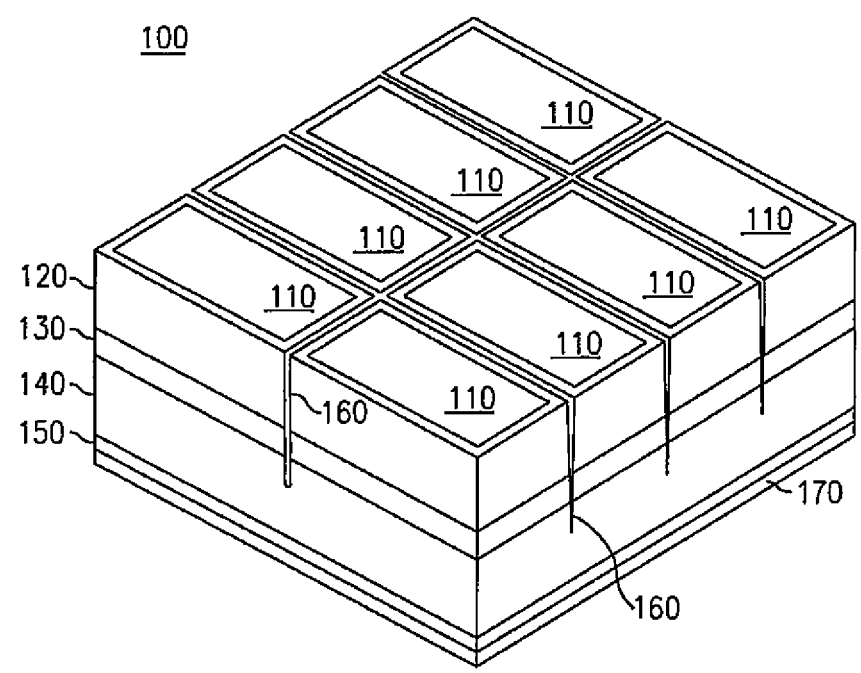
FIG. 1 is a perspective view of one example of a portion of focal plane array of an infrared detector according to aspects of the invention.

Referring to FIG. 1, there is illustrated an example of a focal plane array (FPA) 100 of infrared detectors 110. In the illustrated example, the FPA 100 includes a two-dimensional array of eight detectors 110; however those skilled in the art will appreciate, given the benefit of this disclosure, that the FPA may include any number of detectors arranged in one, two or three dimensions. Additionally, each infrared detector 110 may have any shape and dimension suitable for radiation detection. In this example, each infrared detector 110 includes multiple layers 120, 130, 140, and 170; however, as discussed further below, in other embodiments, the detectors may include more or fewer layers. The layers may comprise semiconductors, metals, or dielectrics. One or more substrates 150 may provide a base upon which, and/or on the lower surface of which, the layer(s) 120, 130, 140 and/or 170 may be formed. The infrared detectors 110 may be at least partially separated from one another by gaps 160 in which little or no absorption occurs.

The substrate 150 may be a wafer comprised of silicon (Si), germanium (Ge), cadmium telluride (CdTe), cadmium zinc telluride (CdZnTe), gallium arsenside (GaAs), and/or any other suitable substrate material or combination of substrate materials upon which, and/or on the lower surface of which, the layers 120, 130, 140, and/or 170 may be formed. The layer(s) 120, 130, 140 and/or 170 may include semiconductor layers formed using any suitable semiconductor process, including epitaxy, for example, such as molecular beam epitaxy, metalorganic vapor phase epitaxy or liquid phase epitaxy. At least one of the layers 120, 130 and/or 140 may include a material having energy bandgaps responsive to radiation in a spectral region (or waveband) of interest (referred to as an absorber layer). Some examples of materials include, but are not limited to, Silicon, GaAs, InGaAs, HgCdTe, Lead chalcogenides, and super lattices.

Figure 2:
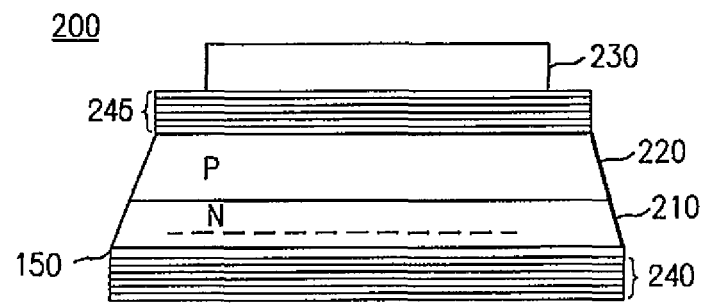
FIG. 2 is a cross-sectional view of one example of an infrared detector according to aspects of the invention.

According to one embodiment, one or more of the detectors 110 are configured to leverage resonant cavity enhancement to thin at least one of the semiconductor layers acting as the absorber for at least one waveband of the detector. Referring to FIG. 2, there is illustrated an example of a single-waveband (also referred to as single-color) photodetector 200, according to one embodiment. The photodetector 200 includes a semiconductor absorber layer 210, which may be formed on a substrate 150 using any suitable semiconductor manufacturing process, as discussed above, and has an energy bandgap responsive to radiation in a spectral region of interest. A semiconductor collector layer 220 is coupled to the absorber layer 210 and provides an electrical connection for the photodetector 200. In the illustrated example, the absorber layer 210 is an n-type layer and the collector layer 220 is a p-type layer, thereby creating a p-n junction. However, it is to be appreciated that the electrical conductivity type of the layers 210, 220 may be reversed in other examples. In addition, as discussed further below, the device may be formed with an NBN-type configuration, rather than a p-n (or an n-p) junction. A contact 230 provides an electrical contact structure for the detector.

A resonant cavity forms part of the detector 200. The resonant cavity operates by resonating incident flux between a first mirror 240 and a second mirror 245, causing a field to be built up in the absorptive region (absorber layer 210) of the detector 200. Generated carriers are separated and collected in the absorptive region in accord with normal operation of a photovoltaic device. In the illustrated example, the resonant cavity is formed with two multilayer dielectric mirrors 240, 245, each of which may be formed by depositing alternating layers of a high-refractive-index dielectric and a low-refractive-index dielectric, each layer having a thickness of approximately ¼ the optical wavelength in the material. The first mirror may be designed to be partially reflective, and the second mirror may be designed to be highly reflective. Moreover, the phase upon reflection of one or both mirrors may be designed, e.g., by suitable selection of the materials and thicknesses of the layers in the mirrors, to result in a standing wave in the optical cavity having a maximum in the electric field in or near the absorber layer 210. As a result, volume reduction (thinning) of the absorber layer 210 may not hinder optical performance of the detector 200, thereby improving signal to noise. The contact 230 may also be reflective and may enhance the reflectivity of the second mirror 245.

In one embodiment, the resonance of the resonant cavity allows the absorber layer 210 to be sufficiently thinned that it may be fully depleted or close to fully depleted at standard operating voltages. Depletion of the absorber layer 210 means that limiting mechanisms at high temperatures, such as Auger recombination, are suppressed. Furthermore, as discussed above, volume reduction also reduces the sensitivity of the device to thermal noise, and reduces "dark current." Dark current is the constant response exhibited by a receptor of radiation during periods when it is not actively being exposed to light. In particular, in the context of a photodetector or photovoltaic device, dark current refers to the relatively small electric current that flows through the photosensitive device when no photons are entering the device.

Figure 3A:
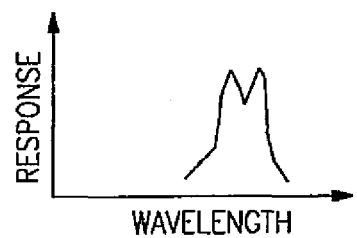
FIG. 3A is a graph illustrating a spectral profile for the example infrared detector of FIG. 2.
Figure 3B:
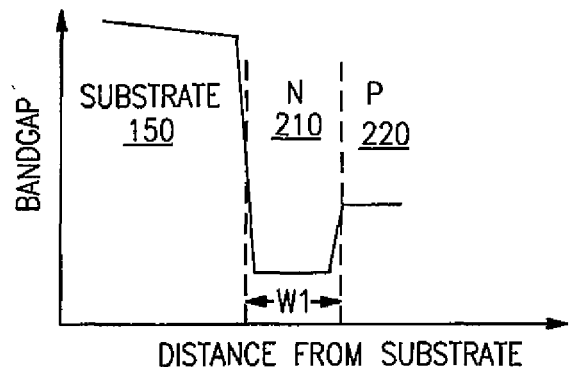
FIG. 3B is a diagram illustrating energy levels in the layers of the infrared detector of FIG. 2.

As discussed above, the detector 200 illustrated in FIG. 2 is a single-color (or single-waveband) device. There are several single-color implementations that may leverage resonant cavity enhancement, yet still have multiple absorber regions for various different sensing applications. For example, the detector 200 of FIG. 2 may provide a narrow-band sensor that may be used for resonant detection. FIG. 3A illustrates an example spectral profile of the detector 200 of FIG. 2 configured as an infrared detector (i.e., the absorber layer 210 is selected to include one or more materials responsive to infrared radiation). FIG. 3A represents a generic spectral response, and would be dependent on the combination of the absorber material cut-off wavelength and optical properties, absorber thickness (which is typically much thinner than a regular absorbing layer as discussed above), and characteristics of the resonant cavity. At any particular wavelength, relevant characteristics of the resonant cavity include the width of the cavity, i.e., the separation between the first mirror and the second mirror, the amplitude and phase of the reflectivity of the first mirror at the particular wavelength, the amplitude and phase of the reflectivity of the second mirror at the particular wavelength, and the round-trip attenuation and phase delay caused by the layers between the first mirror and the second mirror, at the particular wavelength. The manner in which these characteristics change with wavelength affects the spectral response of the resonant cavity. An example would be a MWIR absorber, cut-off ~5 µm, with thickness of approximately 500 nm. FIG. 3B illustrates a corresponding diagram showing energy levels across an example of the detector 200 of FIG. 2. As discussed above, the width W1 of the absorber layer 210 may be made very narrow, in one example, approximately the same as the depletion width of the detector, such that the device may be operated fully depleted. Such a sensor may realize a HOT detector with good performance through the reduction of thermal noise, dark current, and other limiting factors, as discussed above.

According to another embodiment, a single-color photodetector may be implemented for broad-band sensing, by leveraging multiple absorber regions. For example, a broadband detector may be implemented, leveraging the reduced dark current of the device, by confining the longest wavelengths to a very narrow, optionally fully depleted absorber, while allowing other wavelengths to be absorbed through more standard absorbers. An example of such a detector is illustrated in FIG. 4.

Figure 4:
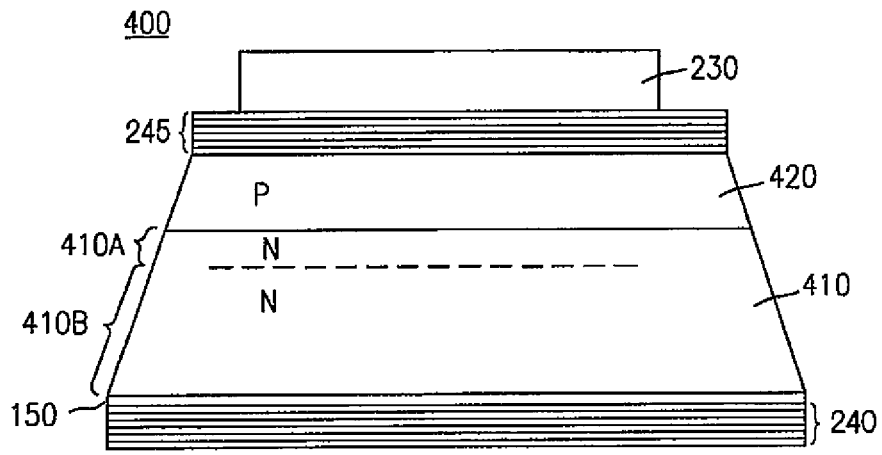
FIG. 4 is a cross-sectional view of another example of an infrared detector according to aspects of the invention.

Referring to FIG. 4, in one example, a single-color broad-band photodetector 400 includes an absorber layer 410 that is divided into two regions, namely, region 410A and region 410B, as shown by the dotted line in FIG. 4. Absorber region 410A may be responsive to a certain group of wavelengths, for example, the longer wavelengths of a waveband of interest, and the absorber region 410B may be sensitive to other wavelengths in the waveband of interest. The resonant cavity may be configured to cause a field to be built up in absorber region 410A at selected wavelengths. Accordingly, absorber region 410A may be made very thin, for example (referring to FIG. 5B), the width W2 of absorber region 410A may be approximately the same as the depletion width. Thus, in one example, the detector 400 may be operated with absorber region 410A fully depleted and leveraging the cavity resonance to achieve high quantum efficiency.

In one example, absorber region 410A resembles the detector 200 of FIG. 2 in operation, and may be a very narrow-band detector. Absorber region 41013 may have a wider spectral range (or bandwidth). For example absorber region 410A might have a peak response at 4.5 μm with a FWHM response of 0.5-1 μm, while absorber 410B has a broad band response over the 1-4.25 μm region. Thus, the combination of the two color absorbers may cover the entire useful MWIR region, while having the dark current performance of only the shorter wavelength material 410B, which dominates dark current in the longer wavelength absorber 410A. The first mirror may be designed to have low reflectivity at wavelengths at which absorber region 410B is sensitive. Thus, absorber region 410B may not receive resonant energy from the resonant cavity, and may absorb photons according to conventional photovoltaic processes. Thus, the resonant cavity may be used to manage where absorption of photons with selected wavelengths occurs within a detector device to improve performance of the device. Accordingly, a broad-band device may be achieved by using the thin, narrow-band absorber region 410A for some wavelengths, and the thicker, broader-band absorber region 410B to capture the other wavelengths. In one example, the thickness of absorber region 410A may be approximately 300 nanometers (nm) and the thickness of absorber region 410B may be approximately 5 micrometers (μm).

Figure 5A:
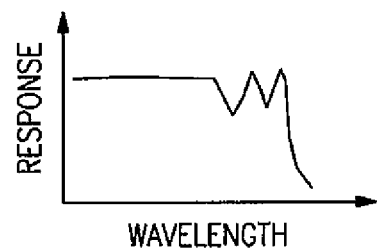
FIG. 5A is a graph illustrating a spectral profile for the example infrared detector of FIG. 4.
Figure 5B:
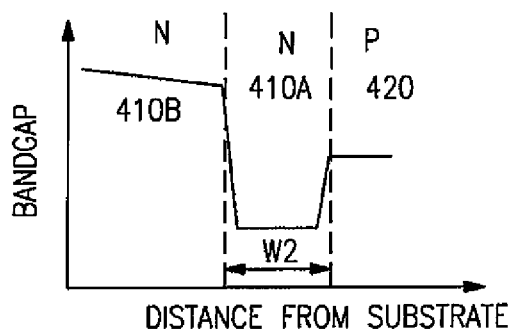
FIG. 5B is a diagram illustrating energy levels in the layers of the infrared detector of FIG. 4.

FIG. 5A illustrates an example spectral profile for an infrared embodiment of detector 400. In one example, the detector 400 is configured for the infrared spectral region extending from approximately 3 μm to 5 μm. In another example, the detector 400 is configured for the infrared spectral region extending from approximately 8 μm to 12 μm. As discussed above, absorber region 410A is configured to detect a first subset of the spectral region, similar to the detector of FIG. 2, and absorber region 410B is configured to detect the remainder of the spectral region; thereby achieving a broad-band, single-color device. As discussed above, FIG. 5B illustrates the corresponding energy level diagram for the example detector of FIG. 4.

As discussed above, other embodiments of detectors may include NBN detectors that instead of a p-n junction include a barrier layer between the absorber and the collector. The resonant cavity may be formed on the collector and the absorber may be thinned, as discussed above.

Figure 6:
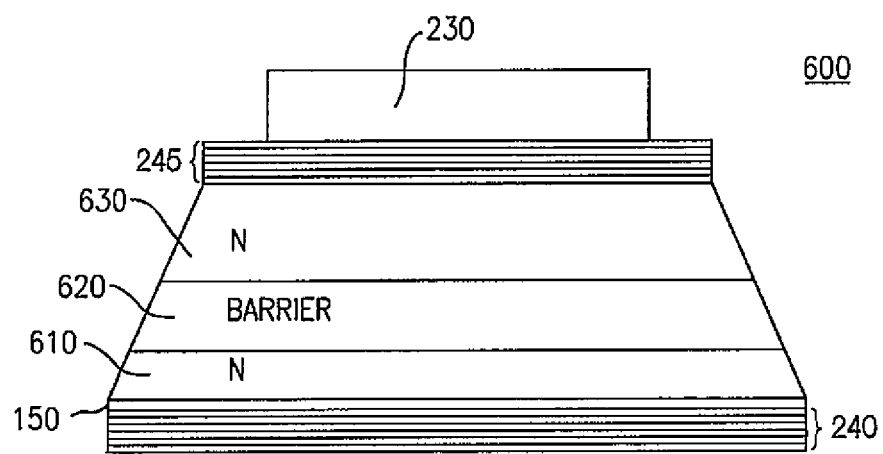
FIG. 6 is a cross-sectional view of another example of an infrared detector according to aspects of the invention.
Figure 7A:
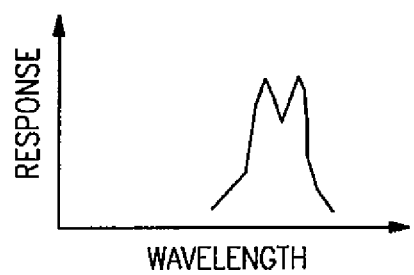
FIG. 7A is a graph illustrating a spectral profile for the example infrared detector of FIG. 6.
Figure 7B:
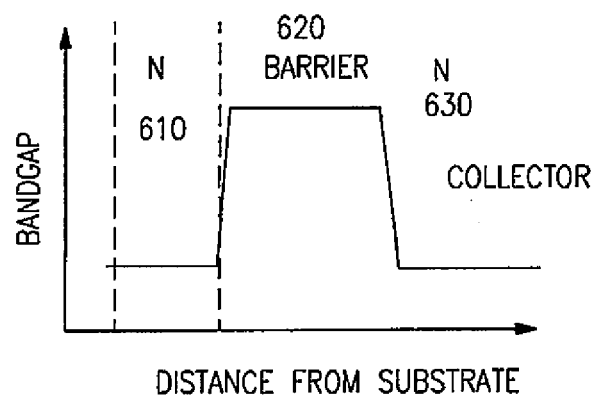
FIG. 7B is a diagram illustrating energy levels in some the layers of the infrared detector of FIG. 6.

One example of an NBN single-color detector is illustrated in FIG. 6. In this example, the detector 600 includes an absorber layer 610, a barrier layer 620 and a collector layer 630. The absorber layer 610 and the collector layer 630 may have the same electrical conductivity type, for example, n-type, and are separated from one another by the barrier layer 620. As discussed above, by configuring the resonant cavity to cause a field to be built up in absorber region 610 at selected wavelengths, the absorber layer may be made very thin. This example detector 600 may be a narrow-band device, and may have a spectral response (an example of which is illustrated in FIG. 7A) similar to that of the detector 200 of FIG. 2. FIG. 7B illustrates an exemplary corresponding energy level diagram for the example detector 600 of FIG. 6. The carrier type of this barrier type structure could also be of the opposite type, e.g. PBP, and in both the case of an NBN structure and the case of a PBP structure, the barrier may be of either p- or n-type.

Figure 8:
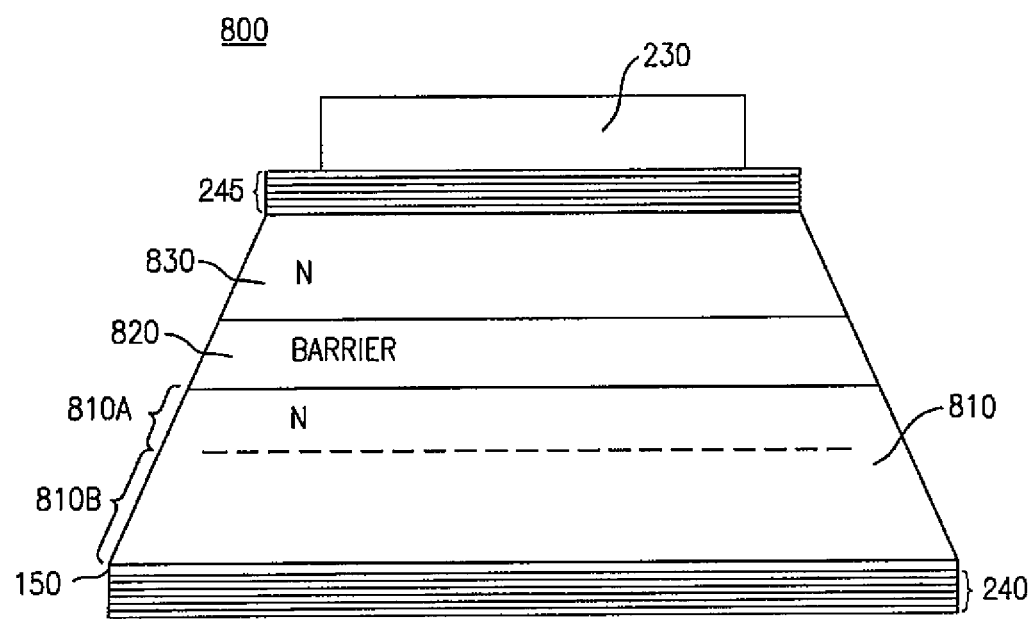
FIG. 8 is a cross-sectional view of another example of an infrared detector according to aspects of the invention.
Figure 9A:
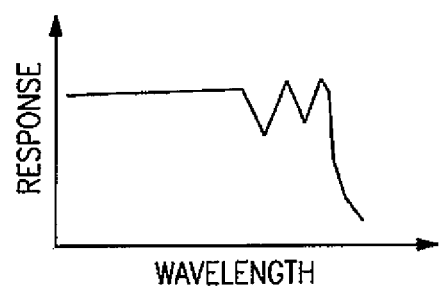
FIG. 9A is a graph illustrating a spectral profile for the example infrared detector of FIG. 8.
Figure 9B:
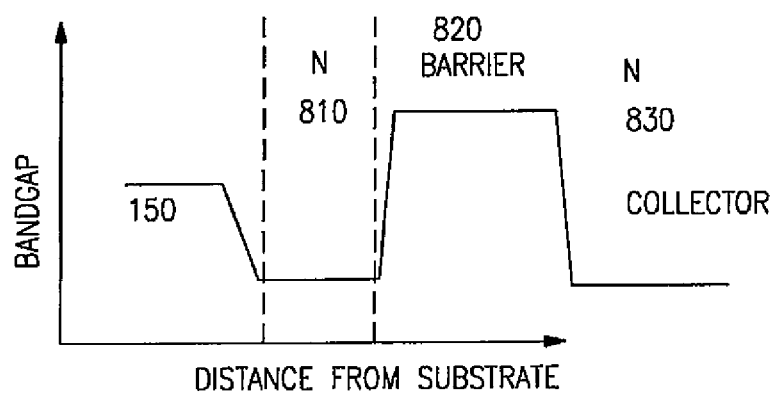
FIG. 9B is a diagram illustrating energy levels in some the layers of the infrared detector of FIG. 8.

A broad-band single color detector, such as that discussed above with reference to FIG. 4, may also be implemented using an NBN configuration. An example of a single-color, dual-absorber detector 800 is illustrated in FIG. 8. In this example, the detector 800 includes an absorber layer 810, which as discussed above, may be divided into two absorber regions 810A and 810B, one of which (810B) may be thinned due to the benefits provided by the resonant cavity. The dual-region absorber layer 810 may provide a broad-band single color spectral response (an example of which is illustrated in FIG. 9A). In one example, the detector 800 may be constructed such that the spectral response is similar to that of detector 400. The absorber layer 810 is separated from a collector layer 830 by a barrier layer 820. As discussed above with respect to FIG. 6, in this configuration, the absorber layer 810 and collector layer 830 may have the same electrical conductivity type. The second mirror of the resonant cavity is formed on the collector layer 830. FIG. 9A illustrates an example of the spectral response of detector 800, and FIG. 9B illustrates a corresponding exemplary energy level diagram.

According to another embodiment, a two-color (or dual-band) device may also be implemented using a resonant cavity, as discussed above. In one example, a dual-band detector leverages resonant cavity enhancement to thin one band of the detector, particularly the band most sensitive to dark current and limiting higher temperature operation. As a result, a HOT two-color or dual-band detector may be realized. In one example, for an infrared two-color detector, the detector may include two absorbing regions of different cut-off. The longer-wavelength absorbing region may be coupled to a resonant cavity, as discussed further below, and may be made very thin, in one example, on the order of the depletion width of the detector. This reduces the volume of the device and the dark current generating sources, while maintaining high quantum efficiency, as discussed above. The shorter-wavelength absorbing region may be a standard thickness absorber, and may not receive resonant energy from the resonant cavity.

Figure 10:
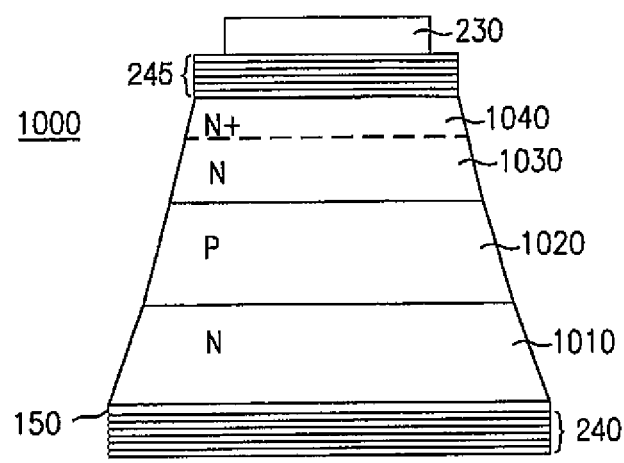
FIG. 10 is a cross-sectional view of another example of an infrared detector according to aspects of the invention.

Referring to FIG. 10, there is illustrated one example of a two-color detector 1000 including a resonant cavity. The detector 1000 includes a first absorber layer 1010 comprising a material having an energy bandgap responsive to radiation in a first spectral region, and a first collector layer 1020, which together provide detection for the first spectral region (referred to as the first color detector). The detector 1000 further includes a second absorber layer 1030 comprising a material having an energy bandgap responsive to radiation in a second spectral region. In the illustrated example, the collector layer for the second absorber 1030 is provided by a highly doped N+ layer 1040; however, in other examples, layer 1040 may be a p-type layer. Layers 1020, 1030 and 1040 together provide the second color detector. A variety of other suitable electrical conductivity variations may be used for the semiconductor layers 1010, 1020, 1030 and 1040. For example, as discussed further below, a dual-band detector may be implemented using an NBN configuration, as illustrated for example in FIG. 12.

In one example, the detector 1000 is an infrared detector, and the first color detector is the shorter wavelength detector and the second color detector is the longer wavelength detector. In a particular embodiment, absorber layer 1010 may have an energy bandgap responsive to a spectral range of approximately 0.5 μm to 5 μm, and semiconductor layer 1030 may have an energy bandgap responsive to a different spectral region, such as, for example, long-wavelength infrared (LWIR). In another example, the dual-band detector 1000 may include one band covering the infrared spectral region from approximately 3 μm to 5 μm, and another band covering the infrared spectral region from approximately 8 μm to 12 μm. In other embodiments, semiconductor layers

1010 and 1030 may be responsive to respective ones or more of near-infrared (NIR), short-wavelength infrared (SWIR), mid-wavelength infrared, LWIR, very-long wave infrared (VLWIR), and/or one or more other spectral regions that may or may not be within the infrared spectrum. As used herein, NIR radiation includes a spectral region extending from approximately 0.5 to 1 µm, SWIR radiation includes a spectral region extending from approximately 1 to 3 µm, MWIR radiation includes a spectral region extending from approximately 3 to 8 µm, LWIR radiation includes a spectral region extending from approximately 8 to 12 µm, and VLWIR radiation includes a spectral region extending from approximately 12 to 30 µm. Longer wavelength infrared radiation is generally more sensitive to thermal noise than is shorter wavelength infrared radiation. Accordingly, it may be advantageous to apply the benefits of the resonant cavity to the longer wavelength (second color) absorber layer 1030. However, in other examples, particularly if the detector 1000 is configured for a spectral region other than the infrared region, the second color detector may be the shorter wavelength detector.

In one embodiment, the second absorber layer 1030 is thinned, for example, until it is approximately a depletion region thickness. As illustrated in FIG. 10, the second absorber layer 1030 is sandwiched between two regions of higher band gap (and also higher doping density), namely the collector layers 1020 and 1040. In one example, the second color detector is operated fully depleted. This reduces Auger recombination, in some instances leaving only G-R current due to Shockley-Read-Hall (SRH) recombination in the depletion region, which may be controlled through careful selection of the material quality (for the material of absorber layer 1030) and is not a fundamental material limit for higher temperature operation. In one example, the second color detector using the resonant cavity is narrow-band, and may be configured for the wavelengths most sensitive to thermal noise, dark current or other limiting effects. The shorter wavelength absorber layer 1010 may be broad-band (as discussed above, this absorber may not be affected by the resonant cavity) and may be used to cover the wavelengths of the absorption spectrum of interest that are not detected by the narrow-band absorber 1030.

Another example of a dual-band radiation detector that may be modified to include a resonant cavity coupled to the absorber layer associated with one spectral band of the detector is described in the '687 Patent.

Figure 11A:
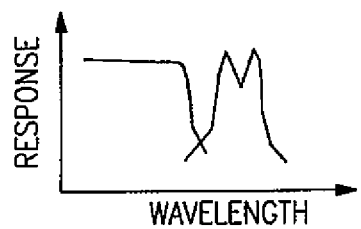
FIG. 11A is a graph illustrating a spectral profile for the example infrared detector of FIG. 10.
Figure 11B:
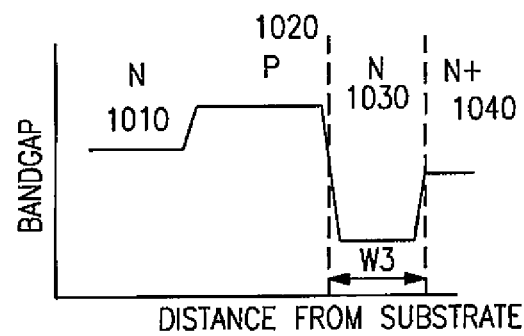
FIG. 11B is a diagram illustrating energy levels in some the layers of the infrared detector of FIG. 10.

FIG. 11A illustrates one example of a spectral profile corresponding to an infrared example of the detector 1000 of FIG. 10. In this example, the first color detector (using absorber layer 610) detects the first (shorter wavelength and broader band, for example the 3-5 µm MWIR window) spectral region 1110, and the second color detector (using the resonant cavity and absorber layer 1030) covers the second (narrow-band, longer wavelength, for example sections of the LWIR 8-12 µm window, with the spectral content defined by the characteristics of the resonant cavity) spectral region 1120. FIG. 11B illustrates a corresponding portion of an energy level diagram including semiconductor layers 1020, 1030 and 1040. As discussed above, in one example, the width W3 of the second absorber layer 1030 may be approximately the depletion thickness of the detector 1000. Examples of thickness include approximately 5-10 µm for Band 1 (the standard absorber, thickness) and 300 nm for Band 2 (with resonant cavity enhancement).

Figure 12:
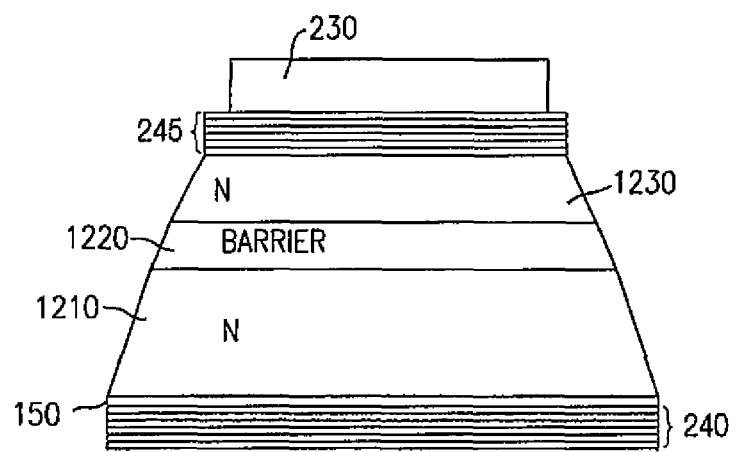
FIG. 12 is a cross-sectional view of another example of an infrared detector according to aspects of the invention.
Figure 13A:
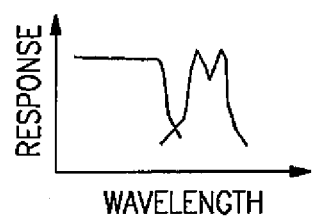
FIG. 13A is a graph illustrating a spectral profile for the example infrared detector of FIG. 12.
Figure 13B:
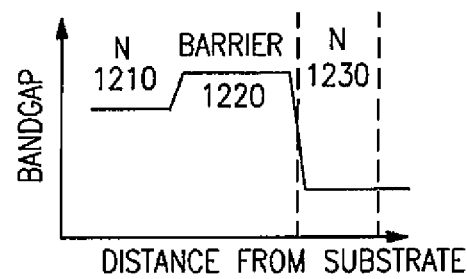
FIG. 13B is a diagram illustrating energy levels in some the layers of the infrared detector of FIG. 12.

As discussed above, a two-color detector may be implemented using an NBN configuration, as illustrated for example in FIG. 12. In this example, the detector 1200 includes a first absorber layer 1210 comprising a material having an energy bandgap responsive to radiation in a first spectral region, and a second absorber layer 1230 comprising a material having an energy bandgap responsive to radiation in a second spectral region. The two absorber layers are separated from one another by a barrier layer 1220. The resonant cavity is coupled to the second absorber layer 1230 and induces a resonance therein, as discussed above, to allow this layer to be thinned while maintaining high quantum efficiency. The carrier type of this barrier type structure could also be of the opposite type, e.g. PBP, and in both the case of an NBN structure and the case of a PBP structure, the barrier may be of either p- or n-type. FIG. 13A illustrates an example of the spectral response of detector 1200, which may be similar to that of detector 1000. FIG. 13B illustrates a corresponding energy level diagram for an example of the detector 1200.

Figure 14:
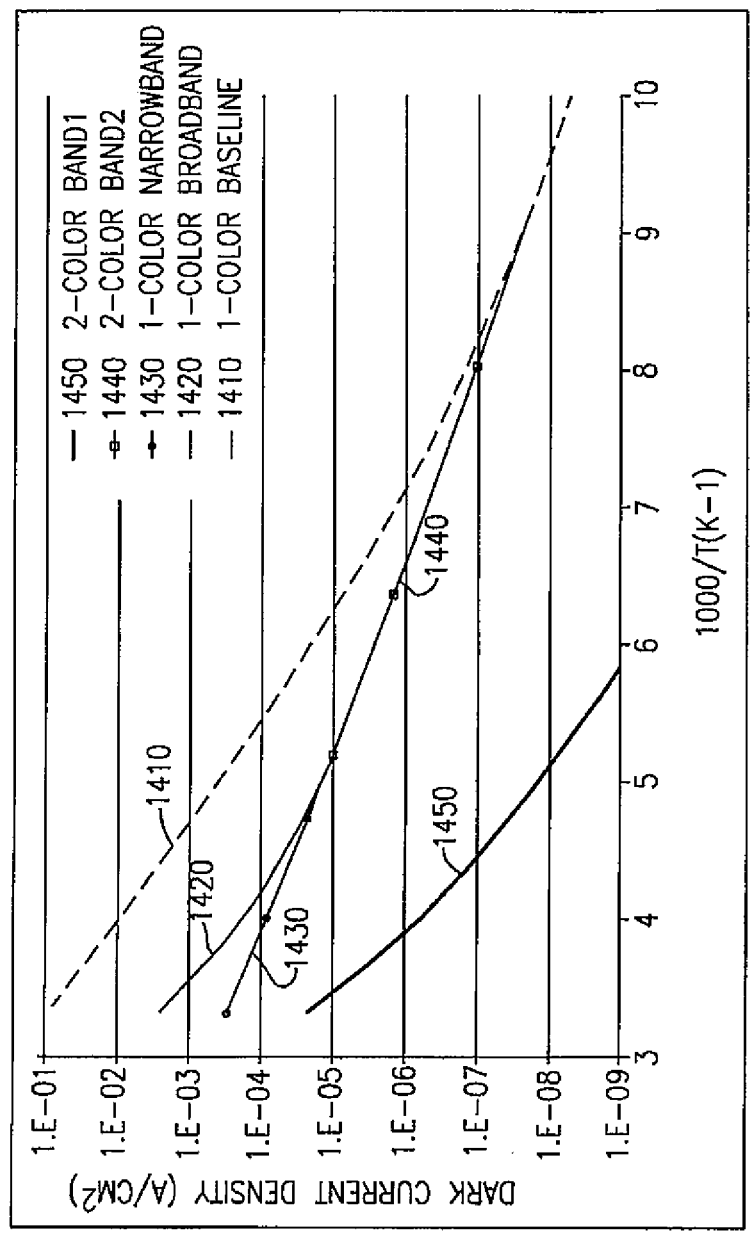
FIG. 14 is a graph illustrating simulated dark currents for the example infrared detectors of FIGS. 2, 4 and 10.

FIG. 14 is a graph showing simulated dark currents for various examples of detectors using resonant cavities in accord with certain embodiments. Dark current in amperes per square centimeter (y-axis) are plotted as a function of the normalized inverse operating temperature of the detector (x-axis; operating temperature decreasing to the right). Trace 1410 represents the dark current for a baseline single color detector without a resonant cavity (standard thickness absorber). Trace 1420 illustrates the dark current for an example of a single color broad-band detector, such as that illustrated in FIG. 4. Trace 1430 illustrates the dark current for an example of a single color narrow-band detector, such as that illustrated in FIG. 2. As can be seen with reference to FIG. 14, the dark current is substantially reduced for these example detectors utilizing the cavity resonance. Traces 1440 and 1450 correspond to an example two-color detector, such as that shown in FIG. 10. Trace 1440 illustrates the dark current for the first spectral region or waveband of the detector (corresponding to absorber layer 1010), and trace 1450 illustrates the dark current for the second spectral region or waveband, corresponding to absorber layer 1030. In one example, by leveraging cavity resonance and operating the detectors fully depleted, an infrared detector may be made to perform with approximately 50 times less dark current at an operating temperature of 200 K than a conventional (e.g., the baseline; trace 1410) infrared detector.

Thus, aspects and embodiments provide a single- or dual-band radiation detector, for example, an infrared detector, in combination with a resonant cavity. As discussed above, the resonant cavity allows volume reduction of the absorber layer of one band (or selection of wavelengths) of the detector, for example, the narrowest bandgap material, while another absorber associated with the other band/color may allow broad-band detection at wavelengths not within the narrow-band spectral region influenced by the resonant cavity. Thus, a HOT detector may be realized by employing the resonant cavity to achieve a thin, optionally fully depleted, absorber for one spectral region or one or more wavelengths (e.g., the spectral region most sensitive to thermal noise or where highest resolution/performance is desired), and using a second absorber material for broader detector response (e.g., for a broad-band single color detector leveraging multiple color absorbing regions) or dual-color applications.

Furthermore, according to one embodiment, the resonant cavity may be designed to allow for selectivity in one or multiple optical regimes. For example a single narrow-band resonance can be designed, and varied across the focal plane array 100 for multi- or hyper-spectral imaging. Thus, referring again to FIG. 1, different detectors 110 in the focal plane array 100 may be configured with different resonant cavities to achieve sensitivity in different spectral regions. For example, the substrate 150 may be wedged so that the resonant wavelength varies across the focal plane array. In another embodiment, the first mirror may be wedged to similar effect. Such a detector array may allow the focal plane to act as a hyperspectral sensor, performing the filtering as a function of pixel position, or more complex pixel-pixel variations may be used to provide multi-color sub pixel type approaches for non-co-registered multi-colored applications. Adjacent pixels may also have varying designs for multi-color subpixel imaging. Wedging the substrate and/or one or both of the mirrors may allow for use of the focal plane array as a hyperspectral imager with multi band widths or as an imaging/spectrometer combination.

As discussed above, in some embodiments, the detectors 200, 400, 600, 800, 1000 and/or 1200 are infrared detectors, and accordingly the semiconductor layers may include materials that are capable of detecting infrared radiation in any one or more of the NIR, SWIR, MWIR, LWIR and/or VLWIR spectral bands. One example material capable of detecting radiation is mercury cadmium telluride (HgCdTe). In one embodiment, the semiconductor layers 120, 130, 140, 210, 410, 1010 and/or 1030 at least partially comprise HgCdTe in the form of Hg(1−x)CdxTe. The x value of the HgCdTe alloy composition may be chosen, for example, so as to tune the optical absorption of the corresponding semiconductor layer to the desired infrared wavelength. In other examples, the semiconductor layers 120, 130, 140, 210, 410, 1010 and/or 1030 may comprise additional and/or alternative materials responsive to radiation. For example, the semiconductor layers 120, 130, 140, 210, 410, 1010 and/or 1030 may comprise mercury cadmium zinc telluride (HgCdZnTe) and/or group III-V semiconductor materials, such as, for example, GaAs, AlGaAs, InAs, InSb, GaSb, and their alloys. As another example layers 120, 130, 140, 210, 410, 1010 and/or 1030 may be based on a type-II strained-layer superlattice structure.

Although limited embodiments of a two color detector leveraging resonant cavity enhancement for performance improvement have been specifically described and illustrated herein, many modifications and variations will be apparent to those skilled in the art. Accordingly, it is to be understood that the two color detector leveraging resonant cavity enhancement for performance improvement employed according to principles of this invention may be embodied other than as specifically described herein. The invention is also defined in the following claims, and equivalents thereof.

What is claimed is:

1. A detector for detecting light at a first wavelength and at a second wavelength, the first wavelength being shorter than the second wavelength, the detector comprising:
  first and second mirrors, forming an optical cavity, the optical cavity being resonant at the second wavelength; and
  first and second semiconductor layers between the first mirror and the second mirror;
  the first semiconductor layer having a bandgap sufficiently low to detect the first wavelength and sufficiently high to be substantially transparent to the second wavelength, and
  the second semiconductor layer having a bandgap sufficiently low to detect the second wavelength,
  wherein the width of the second semiconductor layer is less than 2 times a depletion width of the detector.

2. The detector of claim 1, comprising a third semiconductor layer.

3. The detector of claim 2, wherein the third semiconductor layer is between the first semiconductor layer and the second semiconductor layer.

4. The detector of claim 3, wherein the third semiconductor layer is a barrier layer.

5. The detector of claim 2, wherein the first semiconductor layer and the second semiconductor layer are composed of a semiconductor of a first conductivity type, and the third semiconductor layer is composed of a semiconductor of a second conductivity type, the second conductivity type being different from the first conductivity type.

6. The detector of claim 5, wherein the first semiconductor layer is composed of n-type semiconductor, the second semiconductor layer is composed of n-type semiconductor, and the third semiconductor layer is composed of p-type semiconductor.

7. The detector of claim 5, comprising a fourth semiconductor layer adjacent the second semiconductor layer, the fourth semiconductor layer being composed of a semiconductor of the same conductivity type as the second semiconductor layer, and the fourth semiconductor layer having a higher doping density than the second semiconductor layer.

8. The detector of claim 7, wherein the first mirror and the second mirror are configured to provide, when the detector is illuminated by light at the second wavelength, an increased electric field amplitude in the second semiconductor layer.

9. The detector of claim 2, wherein the third semiconductor layer is a barrier layer.

10. The detector of claim 2, wherein the second semiconductor layer is between the first semiconductor layer and the third semiconductor layer.

11. The detector of claim 10, wherein the first semiconductor layer and the second semiconductor layer are composed of a semiconductor of a first conductivity type, and the third semiconductor layer is composed of a semiconductor of a second conductivity type, the second conductivity type being different from the first conductivity type.

12. The detector of claim 11, wherein the first semiconductor layer is composed of n-type semiconductor, the second semiconductor layer is composed of n-type semiconductor, and the third semiconductor layer is composed of p-type semiconductor.

13. The detector of claim 1, wherein the first mirror and the second mirror are configured to provide, when the detector is illuminated by light at the second wavelength, an increased electric field amplitude in the second semiconductor layer.

14. An array of the detectors of claim 1, the array comprising a substrate, the substrate being wedged.

15. The detector of claim 1, comprising a third semiconductor layer and a fourth semiconductor layer, the third semiconductor layer being a barrier layer and being between the first semiconductor layer and the fourth semiconductor layer, the first semiconductor layer, the second semiconductor layer, and the fourth semiconductor layers being composed of semiconductor material of the same conductivity type.

16. The detector of claim 1, comprising a contact adjacent the second mirror.

17. The detector of claim 16, wherein the contact is reflective and the contact is configured to enhance the reflectivity of the second mirror.

* * * * *